United States Patent [19]
Muller et al.

[11] Patent Number: 6,150,231
[45] Date of Patent: Nov. 21, 2000

[54] OVERLAY MEASUREMENT TECHNIQUE USING MOIRE PATTERNS

[75] Inventors: Karl Paul Muller, Wappingers Falls; Venkatachalam C. Jaiprakash, Beacon; Christopher J. Gould, Stanfordville, all of N.Y.

[73] Assignees: Siemens Aktiengesellschaft, Munich, Germany; International Business Machines Corporation, Armonk, N.Y.

[21] Appl. No.: 09/097,784

[22] Filed: Jun. 15, 1998

[51] Int. Cl.$^7$ .................................................. H01L 21/76
[52] U.S. Cl. .................................................. 438/401
[58] Field of Search .................................. 438/401, 462, 438/800; 257/797, 798; 430/22, 5

[56] References Cited

U.S. PATENT DOCUMENTS

| | | | |
|---|---|---|---|
| 3,690,881 | 9/1972 | King et al. | 430/22 |
| 4,568,189 | 2/1986 | Bass et al. | 356/401 |
| 5,388,517 | 2/1995 | Levien | 101/485 |

FOREIGN PATENT DOCUMENTS

| | | |
|---|---|---|
| 0 370 834 | 5/1990 | European Pat. Off. . |
| 0 534 720 | 3/1993 | European Pat. Off. . |
| 2 293 026 | 3/1996 | United Kingdom . |

OTHER PUBLICATIONS

Patent Abstracts of Japan, vol. 1995,No. 8, Sep. 29, 1995 & JP 02 120221(Oki Electric Ind. Co. Ltd.), May 12, 1995.

Patent Abstracts of Japan, vol. 014, No. 229, May 15,1990 & JP 02 060120(Mitsubishi Electric Corp.), Feb.28, 1990.

Patent Abstracts of Japan, vol. 015, No. 384, Sep. 27, 1991 & JP 03 154803 (Tosoh Corp.) Jul. 2, 1991.

*Primary Examiner*—Charles Bowers
*Assistant Examiner*—Craig Thompson
*Attorney, Agent, or Firm*—Stanton C. Braden

[57] ABSTRACT

Misalignment between two masking steps used in the manufacture of semiconductive devices in a wafer is determined by having a special alignment pattern on each of two masks used in the process and forming images of the masks on the semiconductor devices with the images of the alignment patterns being superimposed over one another to form a Moire pattern. The Moire pattern is compared with other Moire patterns known to correspond to particular amounts of misalignment of the masks to see if it corresponds to an acceptable alignment.

5 Claims, 4 Drawing Sheets

OVERLAY MEASUREMENT TECHNIQUE USING MOIRE PATTERNS

FIELD OF INVENTION

This relates to the manufacture of semiconductor devices, and more particularly, to the use of patterns of marks in overlay measurements that are important in the alignment of the masks used in such manufacture.

BACKGROUND OF THE INVENTION

In the manufacture of most semiconductive devices, particularly integrated circuit devices, much of the processing is done on a wafer scale. In such manufacture, a relatively large wafer, for example a wafer of twelve inches in diameter, is treated to a succession of steps to form the various regions of different conductivity type and the assorted connections that define particular integrated circuit devices. After these are formed, the wafer is diced to form a large number of chips, each of which includes an integrated circuit. It is desirable that the integrated circuits formed all be substantially uniform in characteristics.

Generally the manufacture of such devices includes a succession of processing steps, many of which are controlled by masks that have been provided on a top surface of the wafer to localize the effect of the processing steps to particular regions of the wafer. It is important that such masks be appropriately aligned with respect to one another to achieve the necessary precision in the location of the treated regions, particularly if there is to be achieved the desired uniformity between all of the integrated circuits formed in a wafer.

To achieve the desired alignment of the masks used in successive steps of the processing, it is common to use special marks, or indicia, on the masks to print conforming marks on the edges of the wafer and to use such wafer marks for the overlay measurements important for alignment purposes.

Moreover, it is important to detect any significant misalignment early in the processing so that correction can be made timely before further processing.

Currently the measuring process for detecting misalignment uses boxes, typically square or rectangular, of different sizes etched in the wafer as the alignment marks, and uses boxes of different sizes within one another to detect misalignment. This process is limited both by possible asymmetries in the shape of the box and the width of the lines used to define the box, and by the need for the lines to be sufficiently long and wide that they can be measured directly. This can make the box process relatively inefficient when used in the state of the art integrated circuit devices that involve feature sizes of 0.25 microns or less.

The present invention provides a novel technique for determining mask misalignments and is particularly useful in the manufacture of devices that involve feature sizes of 0.25 microns and less.

SUMMARY OF THE INVENTION

The present invention is based on the use of Moire patterns to provide a measure of any misalignment between two different mask patterns printed on different layer levels in the manufacture of semiconductive devices. A Moire pattern is a distinctive pattern that is formed when there is viewed the superposition on one another of two patterns of closely spaced lines, typically two repetitive patterns that differ only slightly. The structure and location of the Moire pattern can provide a measure of the degree of misalignment of the two line/space repetitive patterns.

In accordance with the present invention, a process for use in the manufacture of semiconductive devices for detecting the misalignment of two separate masking steps is as follows. There is provided in each of the two masks used for the two masking steps a repetitive pattern of marks of a kind that when the two patterns are superposed on one another, there is generated a Moire pattern that is a measure of the degree of misalignment between the two patterns. Each of the masks in turn is used to print at the surface of the semiconductive wafer being processed, superposed on one another, the patterns of marks on the two masks. There is then observed optically the Moire pattern formed by the two patterns of marks. The Moire pattern observed is compared with Moire patterns that are known to define the acceptable range of misalignment between the two masks to decide whether uninterrupted processing of the wafer is warranted.

Stated more succinctly, the present invention is directed to a process for detecting misalignment of the two masking steps in the manufacture of semiconductive devices. The process comprises the steps of including in each of the two masks used for the masking steps a repetitive pattern of marks that when superposed on one another generate a Moire pattern that is a measure of the degree of misalignment between the two masks; using the two masks to form at the surface the semiconductive wafer being processed, the patterns of marks of the two masks superposed on one another, and for generating a Moire pattern; observing optically the Moire pattern generated; and comparing the Moire pattern observed with Moire patterns corresponding to an acceptable alignment between the two masks.

The invention will be better understood from the following more detailed description taken in conjunction with the accompanying drawings.

DETAILED DESCRIPTION

Figure 1:
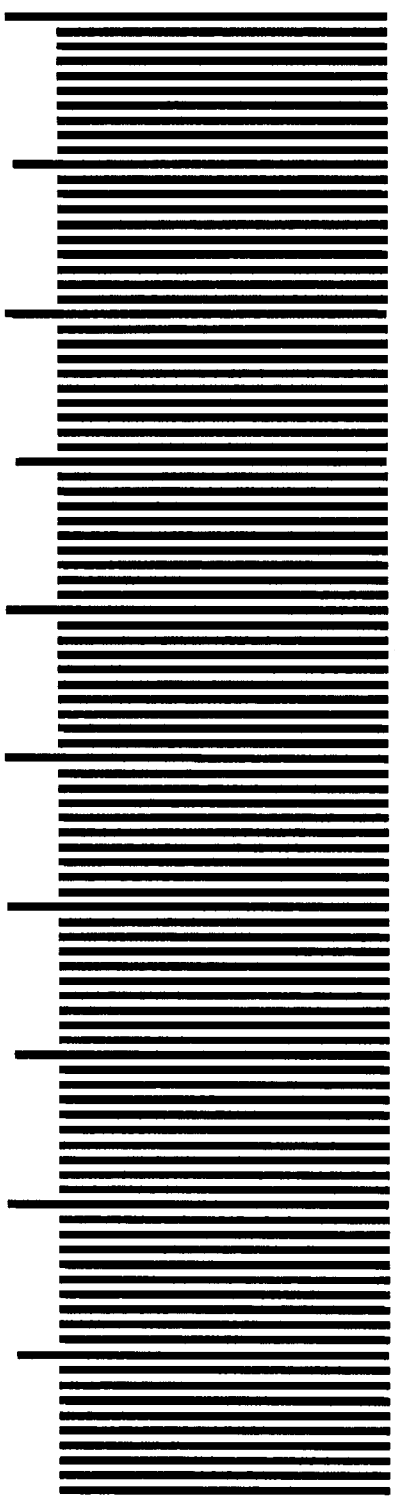
FIG. 1 shows a repetitive pattern of 100 parallel straight lines and spaces of equal width.

With reference now to FIG. 1, there is shown a repetitive alignment pattern, extending an illustrative distance of 42 micrometers, of 100 straight lines and spaces, each of 210 micrometers width. In the practice of the invention, such an alignment pattern would be formed on the first of two masks that are to be used in two processes being controlled. This repetitive pattern of lines is then formed in turn in the photoresist used to define the effect of the process in the silicon wafer. Advantageously this repetitive pattern is etched in at an edge region (kerf) of the wafer.

Subsequently the second mask to be used is provided with a similar repetitive pattern of lines/spaces, although with slightly wider width of the lines and spaces as discussed with reference to FIGS. 1 and 2. It is superimposed over the line/space pattern already etched in the silicon with the first line of the second pattern aligned with the first line of the pattern earlier etched in the silicon. Typically, a photoresist that is to control the second process is first provided between the silicon wafer and the second mask. This second line/space pattern is then etched in the photoresist effectively to superpose the line/space pattern of FIG. 2 over the pattern of FIG. 1.

Figure 3:
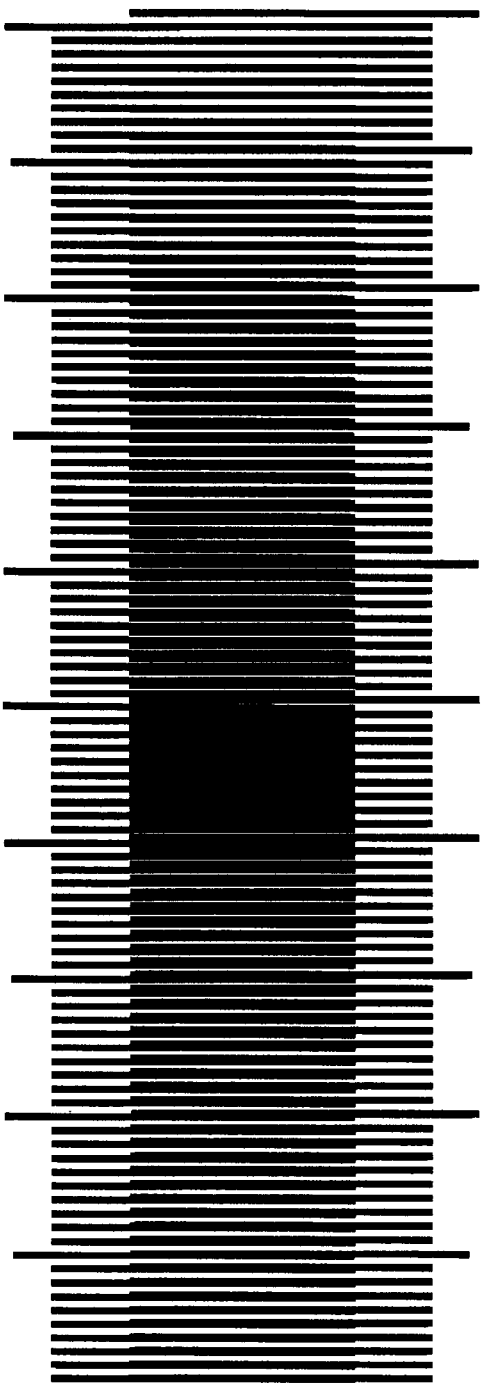
FIG. 3 shows the Moire pattern resulting from the overlay of the pattern of FIG. 2 over the pattern of FIG. 1 when the first lines on the left of each pattern are aligned.

Accurate alignment of the first two lines of the line/space patterns, evidenced by a Moire pattern of the kind shown in FIG. 3, normally would insure the desired close alignment of the masking patterns provided by the two masks, at least in the direction perpendicular to the lines of the line/space patterns.

Figure 4:
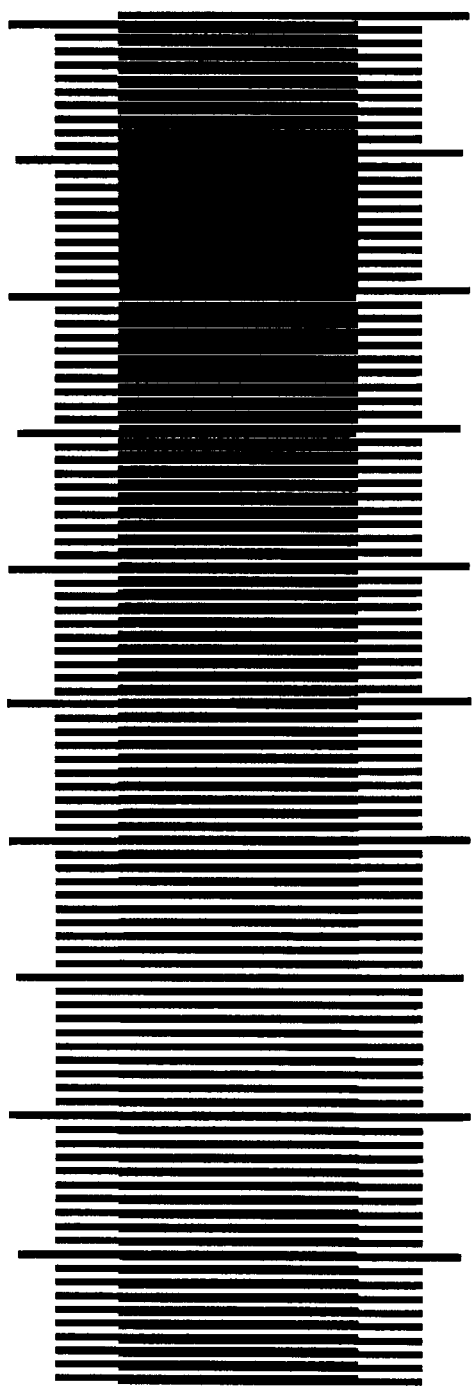
FIG. 4 shows the Moire pattern resulting from a similar overlay of the pattern of FIG. 2 on the pattern of FIG. 1 when the first line of the pattern of FIG. 2 has been shifted to the left by a first amount.
Figure 5:
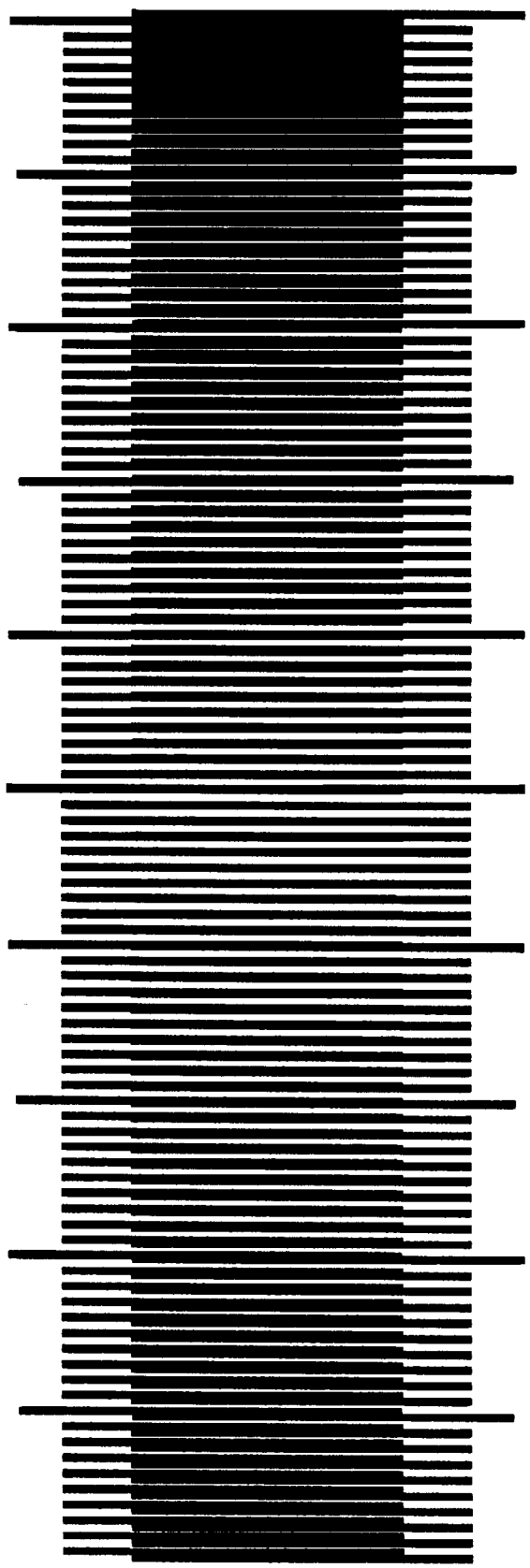
FIG. 5 shows the Moire pattern for the same type of overlay when the first line of FIG. 2 has been shifted to the left an amount twice the amount of the shift represented by FIG. 4.

However, inaccurate alignment of the second mask would be evidenced by a Moire pattern of the kind shown in either FIG. 4 or 5. In this case, the second mask and its photoresist would be removed and a new photoresist would be repatterned with a repositioned mask to correct the misalignment in light of the earlier result.

Figure 2:
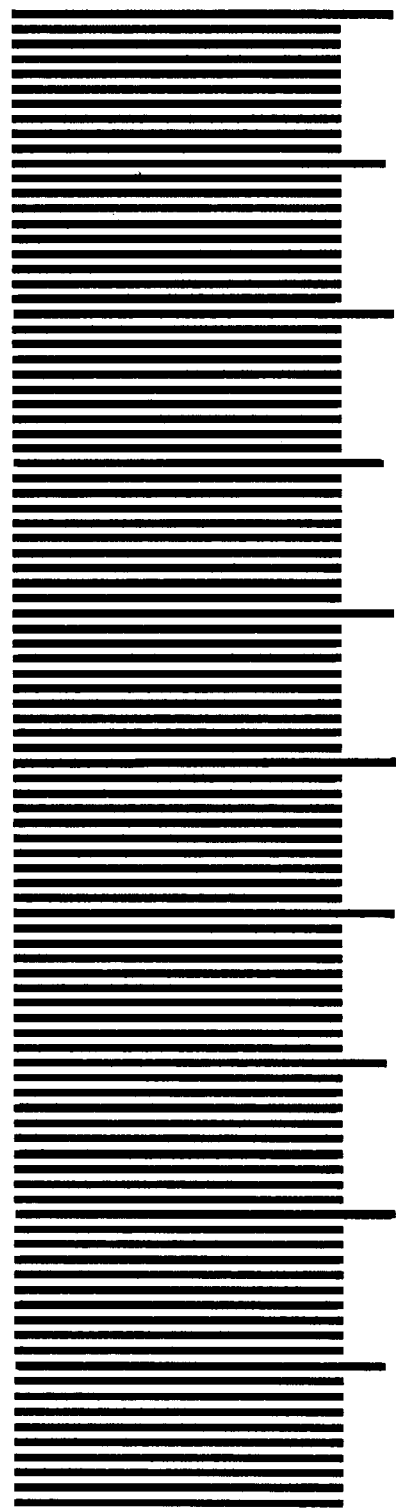
FIG. 2 shows a similar repetitive pattern of straight lines and spaces in which each line and space has been increased in width by 1% as compared with those in the pattern of FIG. 1.

In particular with a misalignment of the pattern of FIG. 2 105 nanometers to the left, as is shown in FIG. 4, the solid black block occurs further to the right than in FIG. 3 by a distance of 10.5 micrometers. This represents an amplification of the misalignment by a factor of 100, determined by the 1% expansion of the pattern of FIG. 2 with respect to the pattern of FIG. 1. With an additional misalignment to the left of another 105 nanometers, a solid black block is formed at the right end of the Moire pattern and a second black block is formed at the left end of the Moire pattern, as is shown in FIG. 5.

Advantageously, the invention is best used by forming a series of calibration Moire patterns corresponding to different misalignments and then examining the operational Moire patterns to see if they correspond to calibration Moire patterns representative of tolerable misalignments.

Typically, the Moire patterns formed are observed optically and compared visually, although systems can be devised to test automatically.

Test patterns of various sensitivities can be devised by changing either the widths of the lines and spaces and/or the difference in their widths. The smaller the difference in widths the more sensitive the test, although typically the more difficult to apply.

Figure 6:
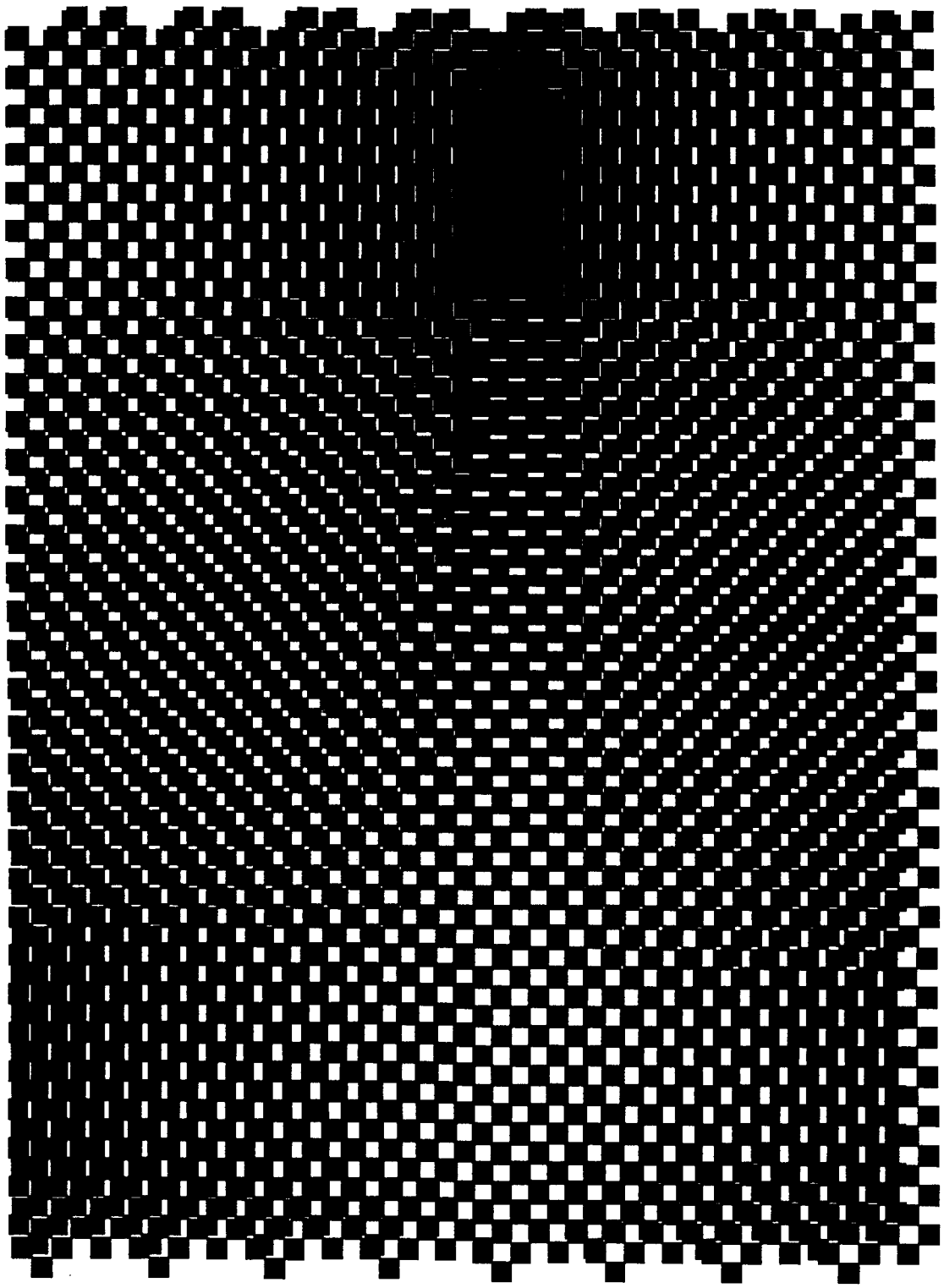
FIG. 6 shows a typical Moire pattern associated with a checkerboard pattern for use for two dimensional alignment.

Accordingly, by appropriate choice of the parameters of the two patterns used to generate the Moire patterns, a desired degree of sensitivity or amplification can generally be obtained. This method can be used to test misalignment in either the horizontal or the vertical direction. Moreover, by use of a checkerboard pattern of squares, of slightly different sizes for the two patterns, measurement of misalignment in both the vertical and horizontal directions can be obtained. Different degrees of misalignments result in different Moire patterns, of which a typical one is shown in FIG. 6.

It is to be understood that the particular process described is merely illustrative of the general principles of the invention. Various modifications are possible consistent with the spirit of the invention, for example, by use of repetitive patterns of curved lines and spaces or other repetitive patterns of lines and spaces.

What is claimed is:

1. A process for detecting misalignment of the two masking steps in the manufacture of semiconductive devices comprising the steps of:

including in each of the two masks used for the masking steps a repetitive pattern of marks that is made different by a prescribed amount in the two masks such that when superposed on one another the masks generate a Moire pattern that is a measure of the degree of misalignment between the two masks;

using the two masks to form at the surface of the semiconductive wafer being processed, the patterns of marks of the two masks superposed on one another for generating a Moire pattern;

observing optically the Moire pattern generated; and comparing the Moire pattern observed with Moire patterns corresponding to an acceptable alignment between the two masks.

2. The process of claim 1 in which the repetitive patterns in the two masks comprise a plurality of lines and spaces that differ only in the widths of the lines and spaces in the two patterns.

3. The process of claim 2 in which the lines and spaces in each pattern are uniform in width and there is a uniform difference in widths of the lines and spaces of the two patterns.

4. The process of claim 1 in which the pattern of marks in each of the two masks is a checkerboard pattern of uniform squares and the size of the squares in the two patterns differs by a prescribed amount.

5. The process of claim 2 in which the degree of difference in the widths of the lines and spaces in the two patterns is about one percent.

* * * * *